United States Patent
Yuzawa et al.

(10) Patent No.: US 11,367,703 B2
(45) Date of Patent: Jun. 21, 2022

(54) BONDING APPARATUS

(71) Applicant: SHINKAWA LTD., Tokyo (JP)

(72) Inventors: Hiroya Yuzawa, Tokyo (JP); Shigeru Hayata, Tokyo (JP); Yuto Hattori, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 16/758,859

(22) PCT Filed: Sep. 19, 2018

(86) PCT No.: PCT/JP2018/034576
§ 371 (c)(1),
(2) Date: Apr. 24, 2020

(87) PCT Pub. No.: WO2019/082558
PCT Pub. Date: May 2, 2019

(65) Prior Publication Data
US 2021/0202432 A1 Jul. 1, 2021

(30) Foreign Application Priority Data
Oct. 26, 2017 (JP) .............................. JP2017-207162

(51) Int. Cl.
*B23K 20/00* (2006.01)
*H01L 23/00* (2006.01)
(Continued)

(52) U.S. Cl.
CPC ............ *H01L 24/78* (2013.01); *B23K 20/004* (2013.01); *B23K 20/02* (2013.01); *B23K 20/26* (2013.01);
(Continued)

(58) Field of Classification Search
CPC ................. H01L 24/78; H01L 23/4952; H01L 23/49575; H01L 2224/789;
(Continued)

(56) References Cited

U.S. PATENT DOCUMENTS 5,293,217 A * 3/1994 Sugawara ............... H01L 24/78
356/625
5,347,362 A * 9/1994 Sugawara ............... H01L 24/85
356/625
(Continued)

FOREIGN PATENT DOCUMENTS

JP H05347326 12/1993
JP H06174437 6/1994
(Continued)

OTHER PUBLICATIONS

"International Search Report (Form PCT/ISA/210) of PCT/JP2018/034576," dated Oct. 23, 2018, with English translation thereof, pp. 1-4.

*Primary Examiner* — Kiley S Stoner
(74) *Attorney, Agent, or Firm* — JCIPRNET

(57) ABSTRACT

A bonding apparatus is provided. This bonding apparatus uses images captured by an imaging apparatus and performs a packaging process for a semiconductor chip and additional processes other than the packaging process. The bonding apparatus is provided with: an aperture switching mechanism provided in an optical system of the imaging apparatus and capable of switching between a first aperture and a second aperture that has an aperture hole diameter greater than that of the first aperture; and a control unit which controls the aperture switching mechanism to switch to either the first aperture or the second aperture. The control unit performs the packaging process using an image captured by switching to the first aperture and performs the (Continued)

additional processes using an image captured by switching to the second aperture.

13 Claims, 13 Drawing Sheets

(51) Int. Cl.
    *B23K 20/02*     (2006.01)
    *B23K 20/26*     (2006.01)
    *H01L 23/495*     (2006.01)
    *B23K 101/40*     (2006.01)

(52) U.S. Cl.
CPC .... *H01L 23/4952* (2013.01); *H01L 23/49575* (2013.01); *B23K 2101/40* (2018.08); *H01L 2224/789* (2013.01)

(58) Field of Classification Search
CPC ........... H01L 2224/48091; H01L 21/52; H01L 2224/78; H01L 21/67259; H01L 21/67144; H01L 2924/00014; H01L 24/85; B23K 20/02; B23K 20/26; B23K 2101/40; B23K 20/10; B23K 20/106; B23K 20/004; B23K 20/005; B23K 20/007
USPC ......... 228/179.1–180.22, 4.5, 904, 102–103, 228/105, 8–12
See application file for complete search history.

(56) References Cited

U.S. PATENT DOCUMENTS

| | | | | |
|---|---|---|---|---|
| 5,365,341 A | * | 11/1994 | Sugawara | G01N 21/956 356/394 |
| 5,394,246 A | | 2/1995 | Sugawara | |
| 5,396,334 A | * | 3/1995 | Sugawara | G01N 21/8806 356/394 |
| 5,796,486 A | * | 8/1998 | Jacob | H01L 21/67259 356/614 |
| 5,854,745 A | * | 12/1998 | Muraoka | H01L 21/67144 700/58 |
| 6,304,243 B1 | * | 10/2001 | Kondo | G09G 3/3611 345/100 |
| 6,317,513 B2 | * | 11/2001 | Michael | G06T 7/254 382/145 |
| 6,610,991 B1 | * | 8/2003 | Case | G01B 11/024 250/559.19 |
| 7,419,085 B2 | * | 9/2008 | Fukunaka | B23K 31/125 219/121.78 |
| 10,586,781 B2 | * | 3/2020 | Hayata | B23K 1/0016 |
| 2005/0284914 A1 | * | 12/2005 | Beatson | B23K 20/007 228/4.5 |
| 2009/0059361 A1 | * | 3/2009 | Hayata | H01L 24/85 359/372 |
| 2009/0124028 A1 | * | 5/2009 | Hayata | H01L 24/78 438/16 |
| 2009/0278035 A1 | * | 11/2009 | Chen | H01L 31/153 250/239 |
| 2011/0284747 A1 | * | 11/2011 | Powell | G01J 5/06 250/330 |
| 2012/0088329 A1 | * | 4/2012 | Ken | H01L 21/304 438/107 |
| 2020/0251518 A1 | * | 8/2020 | Ogino | H01L 27/14634 |

FOREIGN PATENT DOCUMENTS

| | | | | |
|---|---|---|---|---|
| JP | 2969403 B2 | * | 11/1999 | ........... G01R 31/311 |
| JP | 2981941 | | 11/1999 | |
| JP | 2008306040 | | 12/2008 | |
| JP | 2016070795 | | 5/2016 | |

* cited by examiner

| aperture hole diameter (NA) | optical resolution | depth of field | processes to be performed |
|---|---|---|---|
| small <normal aperture> | low | deep | packaging process (packaging process of laminated device or the like) |
| Large <high-resolution aperture> | high | shallow | additional processes (adjustment process, measurement process, or the like) |

BONDING APPARATUS

CROSS-REFERENCE TO RELATED APPLICATION

This application is a 371 application of the international PCT application serial no. PCT/JP2018/034576, filed on Sep. 19, 2018, which claims the priority benefit of Japan application no. 2017-207162, filed on Oct. 26, 2017. The entirety of each of the above-mentioned patent applications is hereby incorporated by reference herein and made a part of this specification.

BACKGROUND OF THE INVENTION

Technical Field

The present invention relates to an optical system of an imaging apparatus arranged in a bonding apparatus.

Related Art

Conventionally, an imaging apparatus (camera and optical system) is arranged in a bonding apparatus, and images captured by the imaging apparatus are used to calibrate the apparatus before packaging of a semiconductor chip, confirm a bonding position during the packaging, inspect the ball shape on a pad after the packaging, and the like.

Patent literature 1 discloses an imaging apparatus for inspecting the ball shape on a pad of a semiconductor chip after packaging. In patent literature 1, a method has been disclosed in which illumination from a low irradiation angle of a low irradiation angle ring-shaped illuminator is used to reduce the incidence of reflected light from the upper surface of the semiconductor chip to an objective lens as much as possible, and then increase an aperture of the optical system to reduce a depth of field, thereby blurring the reflected light from a wire which is not the object to be imaged and brightly projecting only the ball to be imaged.

LITERATURE OF RELATED ART

Patent Literature

Patent literature 1: Japanese Patent No. 2981941

SUMMARY

Problems to be Solved

Meanwhile, in recent years, a laminated device in which a plurality of semiconductor chips is laminated has been increasing. This laminated device has a large thickness, for example, a step between a pad on the uppermost surface of the laminated device and a lead is large. When the laminated device is packaged while an imaging apparatus is used to confirm the position, it is necessary to further widen the visible range in the thickness direction, and thus it is desirable to decrease the aperture of the optical system and increase the depth of field.

However, there is a possibility that the optical resolution is reduced when the aperture of the optical system is decreased, and for example, offset adjustment or the like that requires a high optical resolution cannot be performed. Besides, the offset adjustment is to measure the offset amount between an optical axis and a capillary of a camera before packaging of the semiconductor chip, and the measured offset amount is used during the packaging.

On the other hand, when it is desired to increase the optical resolution for offset adjustment and the like, an increase in the aperture of the optical system is required. However, in this case, the depth of field is reduced, which hinders the packaging of the laminated device. As described above, conflicting requirements exist for the bonding apparatus.

An objective of the present invention is to perform, with high precision, a packaging process for a thick semiconductor chip and additional processes other than the packaging process.

Means to Solve Problems

The bonding apparatus of the present invention, which uses images captured by an imaging apparatus to perform a packaging process for a semiconductor chip and additional processes other than the packaging process. The bonding apparatus includes: an aperture switching mechanism arranged in an optical system of the imaging apparatus and capable of switching between at least a first aperture and a second aperture that has an aperture hole diameter greater than that of the first aperture, and a control unit that controls the aperture switching mechanism to switch to one of the first aperture and the second aperture; wherein the control unit performs the packaging process using an image captured by switching to the first aperture, and performs the additional processes using an image captured by switching to the second aperture.

In the bonding apparatus of the present invention, when the aperture switching mechanism is switched to the first aperture to perform the packaging process, the control unit may not adjust a focal length after switching the aperture; and when the aperture switching mechanism is switched to the second aperture to perform the additional processes, the control unit may adjust the focal length after switching the aperture.

In the bonding apparatus of the present invention, the additional process may be an adjustment process before the packaging process.

In the bonding apparatus of the present invention, the additional process may be a measurement process after the packaging process.

In the bonding apparatus of the present invention, the packaging process may be wire bonding.

In the bonding apparatus of the present invention, the packaging process may be die bonding.

In the bonding apparatus of the present invention, the additional process may be a measurement process for a height of a wire connected to a pad of the semiconductor chip after the packaging process; in the measurement process, the control unit may set a focal length of the imaging apparatus to be fixed, change an optical position of the imaging apparatus to search for a position at which the wire is focused, and acquire the height of the wire based on the optical position of the imaging apparatus at the focused position.

In the bonding apparatus of the present invention, the additional process may be a measurement process for measuring a height of the semiconductor chip from a substrate; in the measurement process, the control unit may set the focal length of the imaging apparatus to be fixed, change an optical position of the imaging apparatus to search for a position at which the semiconductor chip is focused, and acquire the height of the semiconductor chip from the substrate based on the optical position of the imaging apparatus at the focused position.

In the bonding apparatus of the present invention, the additional process may be a measurement process for measuring a height of a press-bonded ball formed by a wire press-bonded to a pad of the semiconductor chip; in the measurement process, the control unit may set the focal length of the imaging apparatus to be fixed, change an optical position of the imaging apparatus to search for a position at which the press-bonded ball is focused, and acquire the height of the press-bonded ball based on the optical position of the imaging apparatus at the focused position.

Effect

According to the present invention, it is possible to perform, with high precision, packaging for a thick semiconductor chip and to use an imaging apparatus in the state of a second aperture having a large aperture hole diameter to thereby increase the optical resolution and perform additional processes other than the packaging process with high precision.

BRIEF DESCRIPTION OF THE DRAWINGS

FIG. 5 is a diagram showing the resolution, the depth of field, and processes to be performed with respect to an aperture hole diameter.

DESCRIPTION OF THE EMBODIMENTS

Hereinafter, embodiments of the present invention are described with reference to the drawings. In the following description, the feed direction of a lead frame 61 is described as an X-direction, the width direction of the lead frame 61 is described as a Y-direction, and the height direction is described as a Z-direction. Besides, the lead frame 61 is an example of a substrate.

Figure 1:
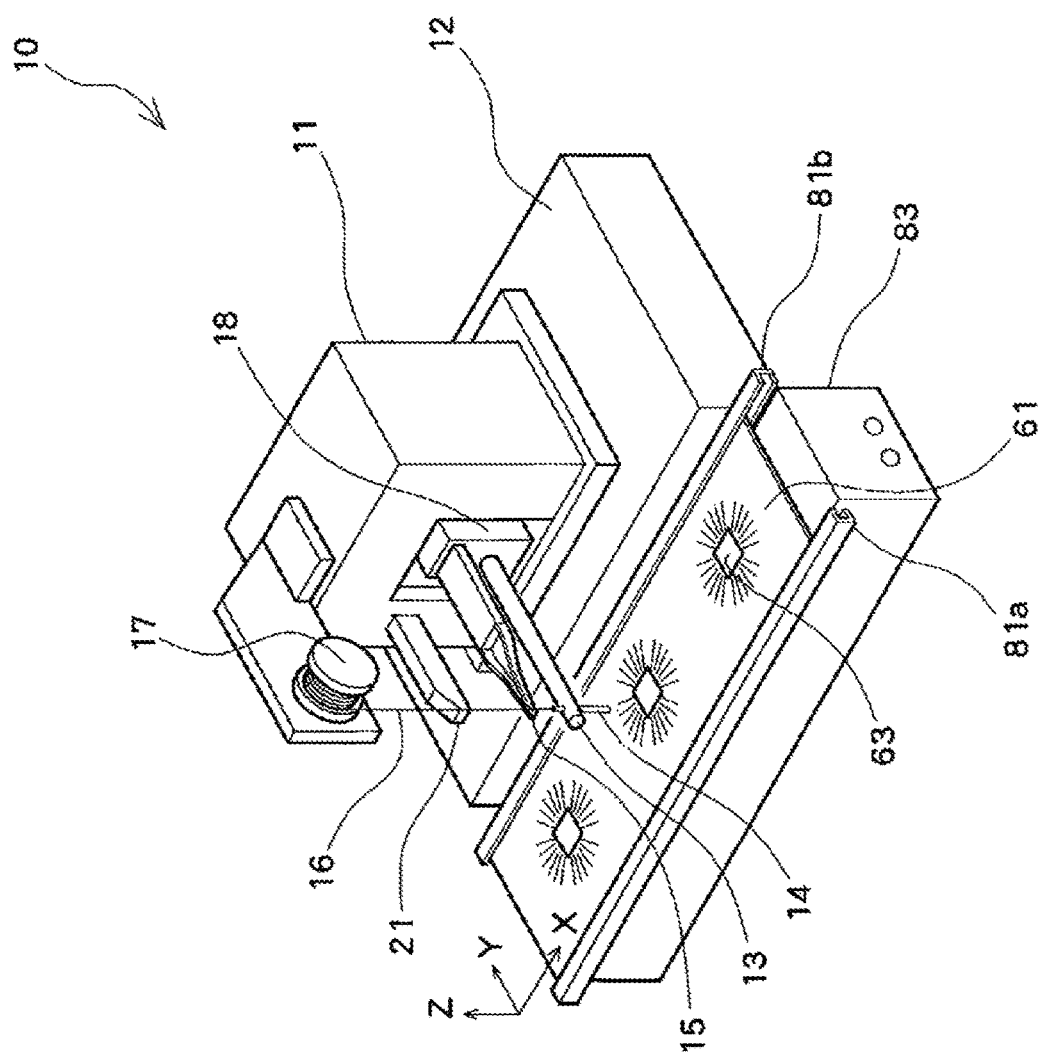
FIG. 1 is a perspective view showing a wire bonder having an imaging apparatus.

The bonding apparatus of the embodiment is a wire bonder 10. FIG. 1 is a perspective view of the wire bonder 10. As shown in FIG. 1, the wire bonder 10 includes a Z-direction driving mechanism 18 which is attached inside a bonding head 11, the bonding head 11 being attached on an XY table 12 and capable of freely moving in the XY-direction. An ultrasonic horn 13 and a clamper 15 are attached to the Z-direction driving mechanism 18, and a capillary 14 is attached to the front end of the ultrasonic horn 13. A wire 16 is inserted through the capillary 14, and the wire 16 is configured to be supplied from a spool 17. Besides, an imaging apparatus 21 is fixed to the bonding head 11.

Guide rails 81a and 81b for guiding the lead frame 61 to which a semiconductor chip 63 is attached in a die bonding step, and a bonding stage 83 for vacuum-attracting the lead frame 61 are attached to a frame (not shown) of the wire bonder 10.

The wire bonder 10 detects the positions of the semiconductor chip 63 and the lead frame 61 according to the image acquired by the imaging apparatus 21, moves the position of the capillary 14 by the XY table 12 to make the position match the position of the pad on the semiconductor chip 63, and then operates the Z-direction driving mechanism 18 to drive the capillary 14 attached to the front end of the ultrasonic horn 13 in the Z-direction, and bonds the wire 16 between the pad of the semiconductor chip 63 and the lead of the lead frame 61 with the wire 16 inserted through the capillary 14 (wire bonding).

When the bonding between the pad of one semiconductor chip 63 and the lead of the lead frame 61 is completed, the wire bonder 10 moves the capillary 14 onto the next pad by the XY table 12, and bonds each pad and lead by the wire 16 in the same manner as described above. Then, when all the pads of one semiconductor chip 63 are connected to the respective leads of the lead frame 61 by the wire 16, the lead frame 61 is transported so that the next semiconductor chip 63 comes to the bonding position. The imaging apparatus 21 acquires images of the semiconductor chip 63 and the lead frame 61, the position of the capillary 14 is determined based on the acquired images, and the wire bonding is performed. Besides, as described later, the imaging apparatus 21 is used not only in the wire bonding which is a packaging process, but also in the additional processes before and after the packaging process.

Figure 2:
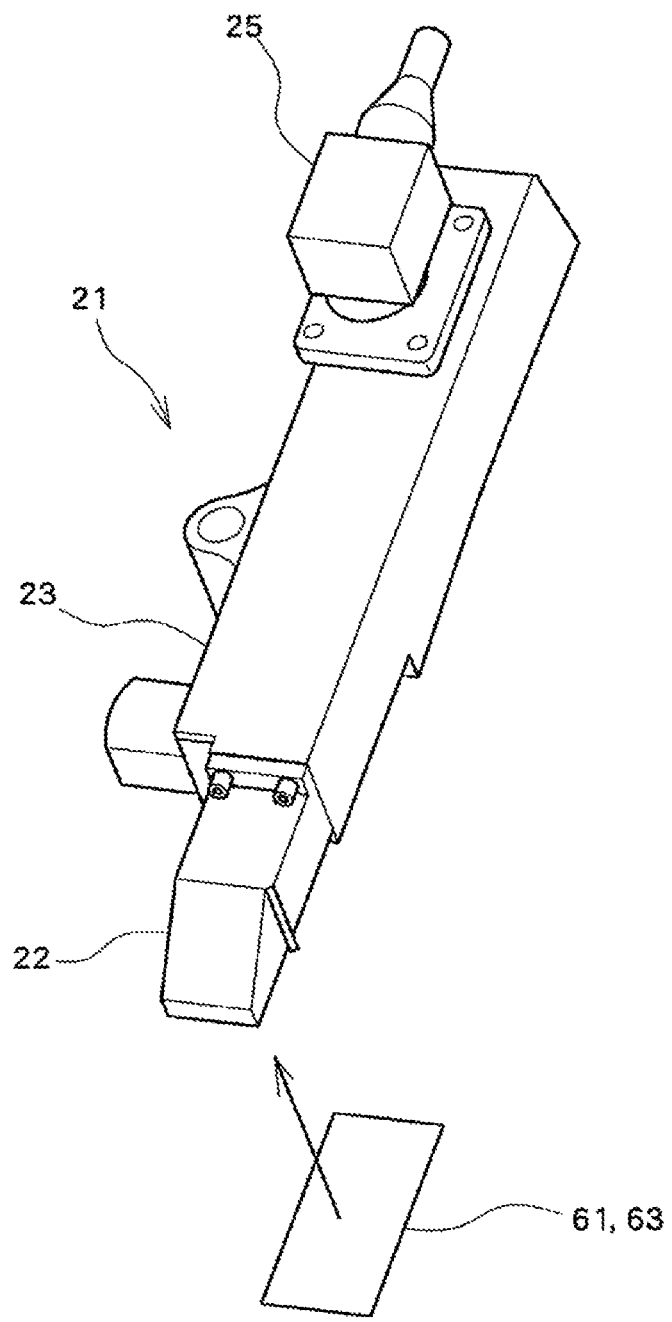
FIG. 2 is a perspective view of the imaging apparatus.

FIG. 2 is a perspective view of the imaging apparatus 21. As shown in FIG. 2, the imaging apparatus 21 includes: an introduction unit 22 introducing light from the semiconductor chip 63 or the lead frame 61 which is a subject, a lens barrel 23 including an optical component such as a lens or a mirror therein and guiding the light that has entered the introduction unit 22, and a camera 25 attached to the lens barrel 23 and including an imaging element that receives the light passed through the lens barrel 23. Besides, although not shown in FIG. 2, an illumination for illuminating the subject is arranged on the inner side of the introduction unit 22.

Figure 3:
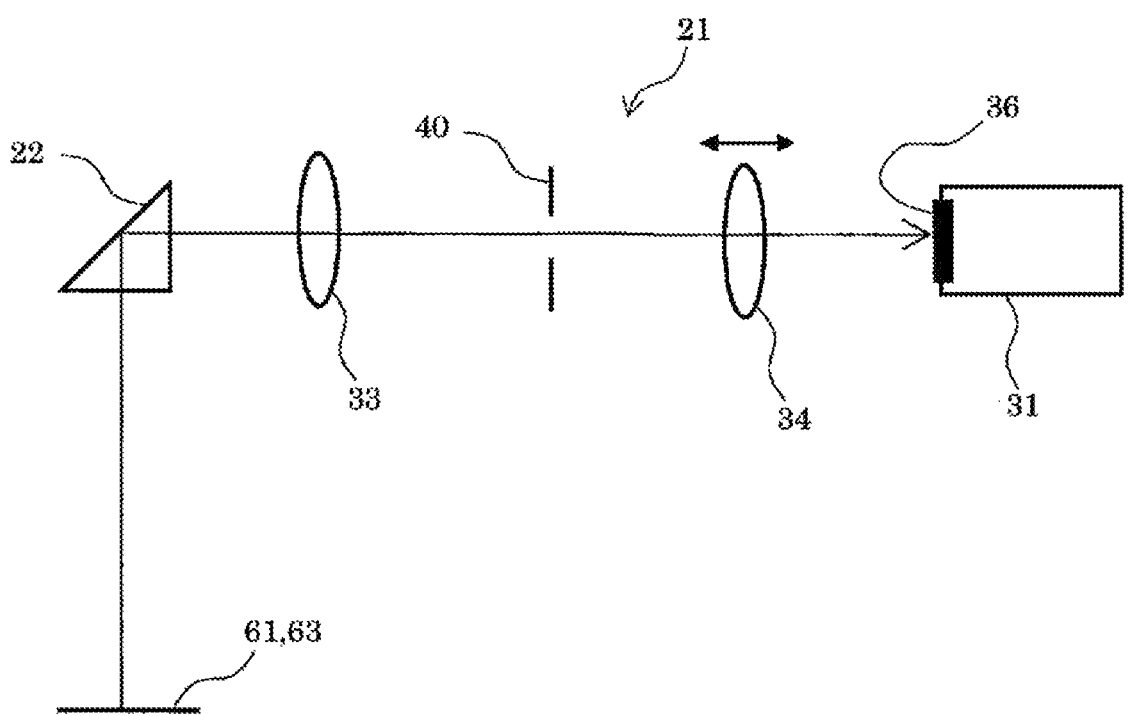
FIG. 3 is an illustration diagram showing a configuration of an optical system of the imaging apparatus.

FIG. 3 is a diagram showing a configuration of an optical system of the imaging apparatus 21. As shown in FIG. 3, the imaging apparatus 21 has an optical system including an optical path from the semiconductor chip 63 or the lead frame 61 which is a subject via the introduction unit 22 through a subject-side lens 33, an aperture (an aperture switching mechanism 40), and a camera-side lens 34 to an imaging surface 36. In addition, the imaging apparatus 21 has an imaging element 31 that converts an image formed on the imaging surface 36 into an electric signal. The imaging element 31 is configured by a CCD element or a CMOS element including a large number of pixels, or by a CCD element and a CMOS element, or the like, and can convert an image into an electric signal of each pixel and output the electric signal. The imaging apparatus 21 of the embodiment can change the aperture hole diameter by having the aperture switching mechanism 40. In addition, the imaging apparatus 21 of the embodiment can perform focus adjustment by moving the camera-side lens 34 forward and backward.

Figure 4:
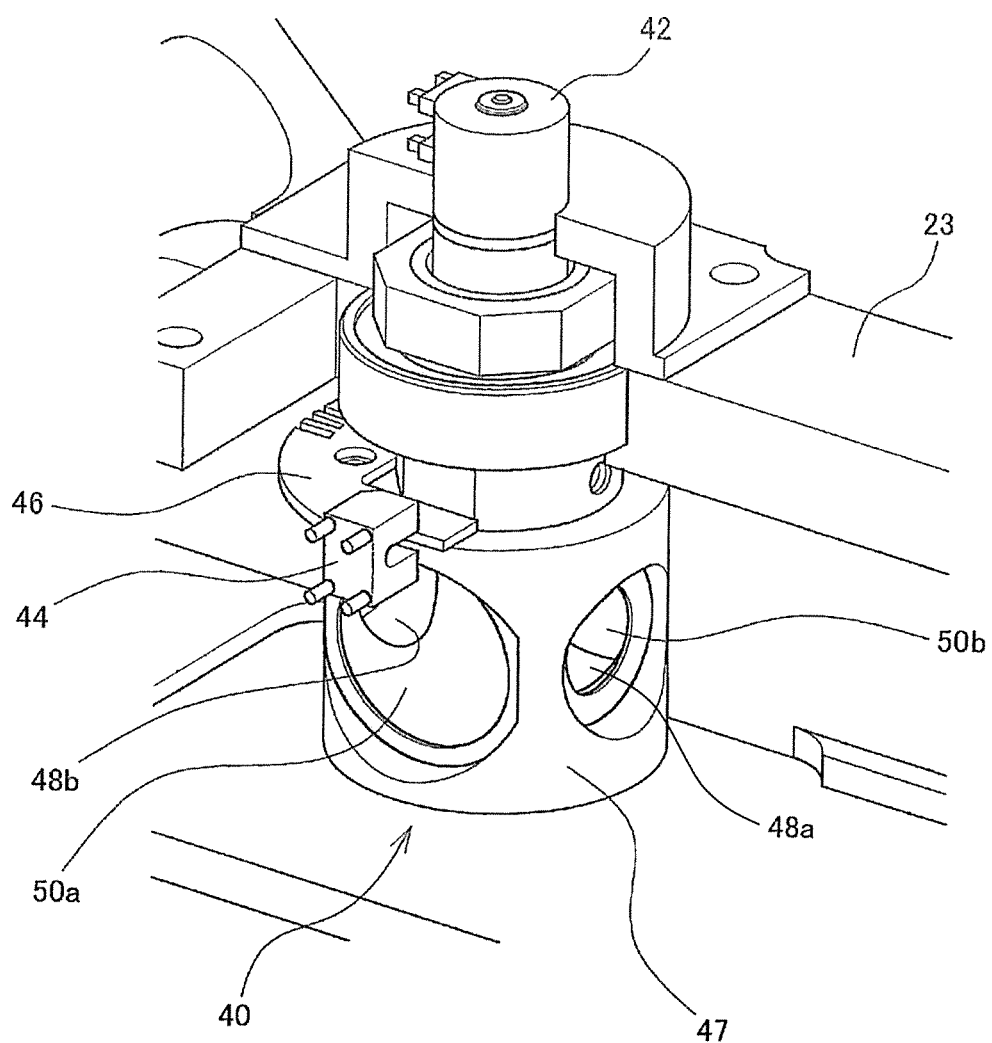
FIG. 4 is a perspective view of an example of an aperture switching mechanism of the imaging apparatus.

FIG. 4 is a perspective view of an example of the aperture switching mechanism 40 arranged in the lens barrel 23 of the imaging apparatus. As shown in FIG. 4, the aperture switching mechanism 40 includes: a cylindrical portion 47 having two small holes 48*a* and 48*b* constituting a small-diameter aperture and two large holes 50*a* and 50*b* constituting a large-diameter aperture, a driving motor 42 for rotating the cylindrical portion 47, a rotation detection dog 46 rotating with the cylindrical portion 47, and a rotation detection sensor 44 fixed to the inner wall of the lens barrel 23 and detecting the rotation amount of the rotation detection dog 46 (the cylindrical portion 47). In the cylindrical portion 47, the two small holes 48*a* and 48*b* are formed to face each other, and similarly, the two large holes 50*a* and 50*b* are formed to face each other. The two small holes 48*a* and 48*b* have the same hole diameter (radius), and similarly, the two large holes 50*a* and 50*b* have the same hole diameter. In addition, the hole diameters of the small holes 48*a* and 48*b* are smaller than the hole diameters of the large holes 50*a* and 50*b*.

As shown in FIG. 4, the cylindrical portion 47 is disposed inside the lens barrel 23, and the two small holes 48*a* and 48*b* or the two large holes 50*a* and 50*b* are located in the optical path accordingly. FIG. 4 shows a state in which the two small holes 48*a* and 48*b* constituting a small-diameter aperture are located in the optical path. By rotating the cylindrical portion 47 for 90 degrees by the driving motor 42, the two large holes 50*a* and 50*b* constituting a large-diameter aperture are located in the optical path. Besides, by detecting the rotation amount with the rotation detection dog 46 and the rotation detection sensor 44 when the cylindrical portion 47 is rotated, the two small holes 48*a* and 48*b* or the two large holes 50*a* and 50*b* are accurately aligned with the optical path. In this manner, the imaging apparatus of the embodiment enables, by the aperture switching mechanism 40, switching between a small-diameter aperture (a first aperture) and a large-diameter aperture (a second aperture).

FIG. 5 is a table showing the optical resolution, the depth of field, and processes to be performed with respect to an aperture hole diameter of the imaging apparatus. As shown in FIG. 5, when the aperture hole diameter is large (when the large-diameter aperture is used), the optical resolution is higher than the case when the aperture hole diameter is small (when the small-diameter aperture is used). This is already known, and a resolution value δ can be calculated by, for example, the following (Equation 1). The smaller the resolution value δ is, the higher the optical resolution is.

$$\delta = 0.61 \times (\lambda/NA) \quad \text{(Equation 1)}$$

Besides, λ in (Equation 1) denotes a wavelength of light, and NA denotes an aperture ratio of the aperture.

Figure 6:
In FIG. 6, (A) is a diagram showing an image captured by switching to a normal aperture, and (B) is an image captured by switching to a high-resolution aperture.
Figure 6:

Hereinafter, the small-diameter aperture is also referred to as a "normal aperture", and the large-diameter aperture is also referred to as a "high-resolution aperture". (A) of FIG. 6 is an image captured by the imaging apparatus using the normal aperture (the small-diameter aperture), and (B) of FIG. 6 is an image captured by the imaging apparatus using the high-resolution aperture (the large-diameter aperture) with the same subject as in (A) of FIG. 6. As shown in FIG. 6, it can be seen that the image in (B) of FIG. 6 in a case of the high-resolution aperture is clearer than the image in (A) of FIG. 6 in a case of the normal aperture.

On the other hand, as shown in FIG. 5, the depth of field is larger in the case of the normal aperture (in the case of using the small-diameter aperture) than in the case of the high-resolution aperture (in the case of using the large-diameter aperture). Thus, in the embodiment, switching to the high-resolution aperture is made and the imaging apparatus is used in a process that requires a high optical resolution, and switching to the normal aperture is made and the imaging apparatus is used in a process that requires a large depth of field. More specifically, as shown in FIG. 5, switching to the high-resolution aperture is made and the imaging apparatus is used in an adjustment process before the packaging process such as wire bonding and a measurement process after the packaging process (hereinafter also referred to as additional processes), and switching to the normal aperture is made and the imaging apparatus is used in the packaging process.

Figure 7:
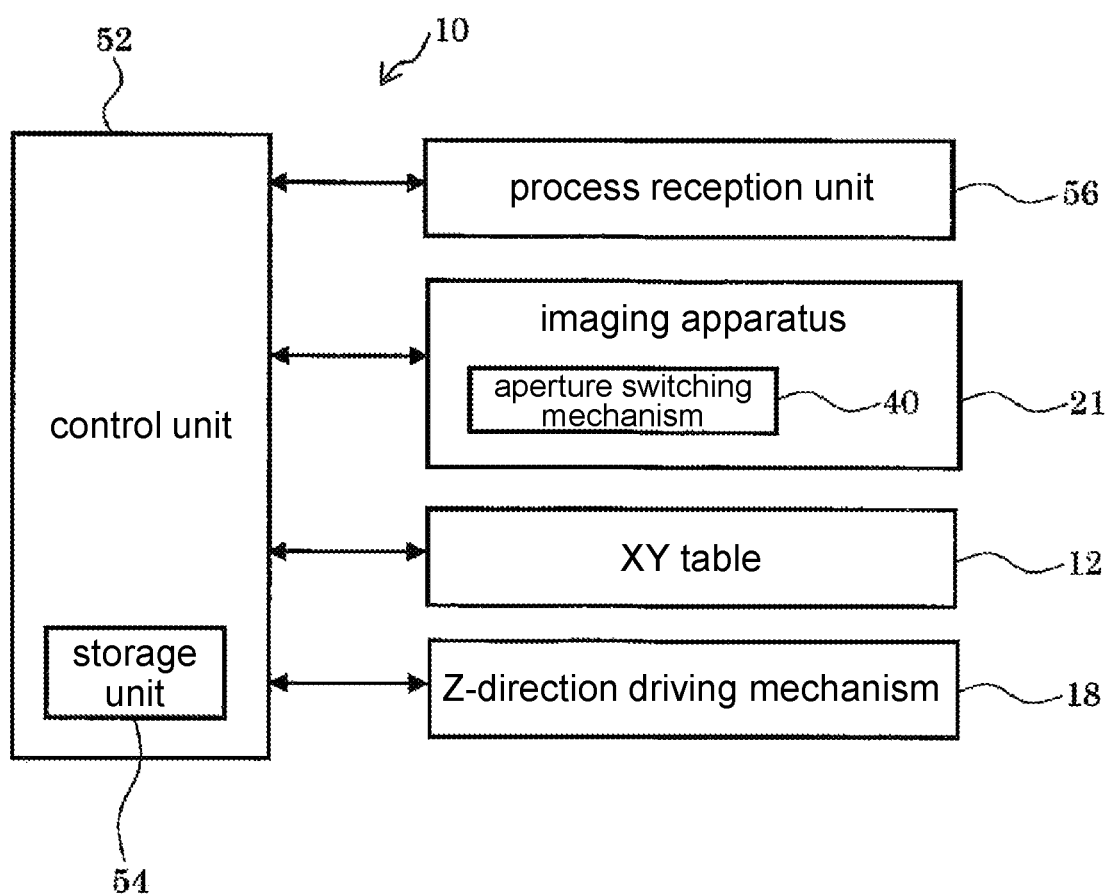
FIG. 7 is a block diagram schematically showing a control configuration of the wire bonder.

Next, a control configuration of the wire bonder of the embodiment is described. FIG. 7 is a block diagram schematically showing a control configuration of the wire bonder 10. As shown in FIG. 7, the wire bonder 10 includes a control unit 52, a storage unit 54, and a process reception unit 56. The control unit 52 includes a processor such as a CPU and performs a process according to a program stored in the storage unit 54. Thereby, the control unit 52 performs switching between the small-diameter aperture and the large-diameter aperture of the aperture switching mechanism 40, and performs a process received via the process reception unit 56. The storage unit 54 is a ROM, a RAM, a flash memory or the like, and stores a program executed by the control unit 52, temporary data, and the like. The process reception unit 56 is, for example, a touch panel, displays a setting screen and the like, and receives a process instruction from an operator. The control unit 52 is connected to the process reception unit 56, the imaging apparatus 21, the XY table 12, and the Z-direction driving mechanism 18, and can control each of them.

Figure 8:
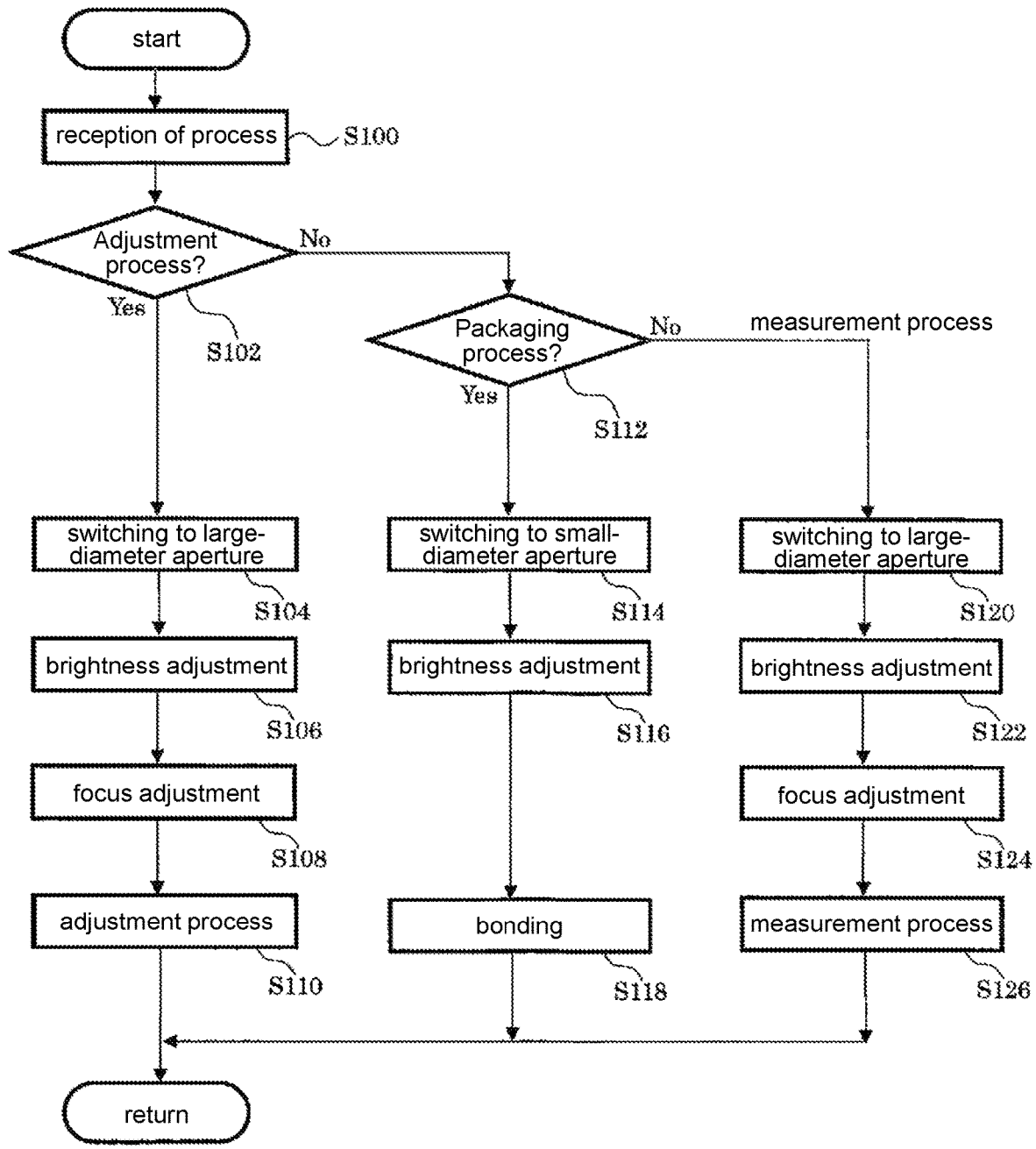
FIG. 8 is a flowchart showing a flow of processes performed by a control unit.

Next, processes performed by the control unit 52 of the wire bonder 10 of the embodiment are described. FIG. 8 is a flowchart showing a flow of the processes performed by the control unit 52.

As shown in FIG. 8, first, the control unit 52 receives a process instruction from an operator via the process reception unit 56 in S100. Here, any process type among the adjustment process before the packaging process, the packaging process (wire bonding), and the measurement process after the packaging process is received. Besides, actually, details of the specific process of the adjustment process (offset adjustment, bond coordinate setting and the like described later), or details of the specific process of the measurement process (measurement of the clearance amount on the pad, detection of the ball diameter on the pad and the like described later) are received.

Next, in S102, the control unit 52 confirms whether the received process is an adjustment process before the packaging process. Here, the adjustment process refers to offset adjustment, which is one of the calibrations of the apparatus, bond coordinate setting before packaging, and the like. In order to perform these processes with high precision, it is necessary to capture a high-resolution image by the imaging apparatus. Thus, the high-resolution aperture is used in the adjustment process as described later.

Here, the offset adjustment and the bond coordinate setting are briefly described. First, the offset adjustment is described. The imaging apparatus 21 is attached to the bonding head 11 with the optical axis thereof offset from the capillary 14 by a fixed distance in the X or Y-direction or in both the X-direction and the Y-direction. During wire bonding, an image of a mark and the like on the surface of the semiconductor chip 63 is acquired by the imaging apparatus 21, and the position of the semiconductor chip 63 and the position of the pad disposed on the semiconductor chip 63 are acquired from the acquired image. Then, the bonding head 11 is moved by the offset amount, and the bonding is performed by aligning the capillary 14 with the position of the pad. The offset amount is the distance between the optical axis of the imaging apparatus 21 and the axial center of the capillary 14 and thus is acquired in advance. However, the offset amount changes every moment due to thermal expansion of the lens barrel of the imaging apparatus 21, the arm of the ultrasonic horn 13, or the like caused by radiant heat from the bonding stage 83. Therefore, it is necessary to measure and calibrate the offset amount, which is the offset adjustment.

Figure 9:
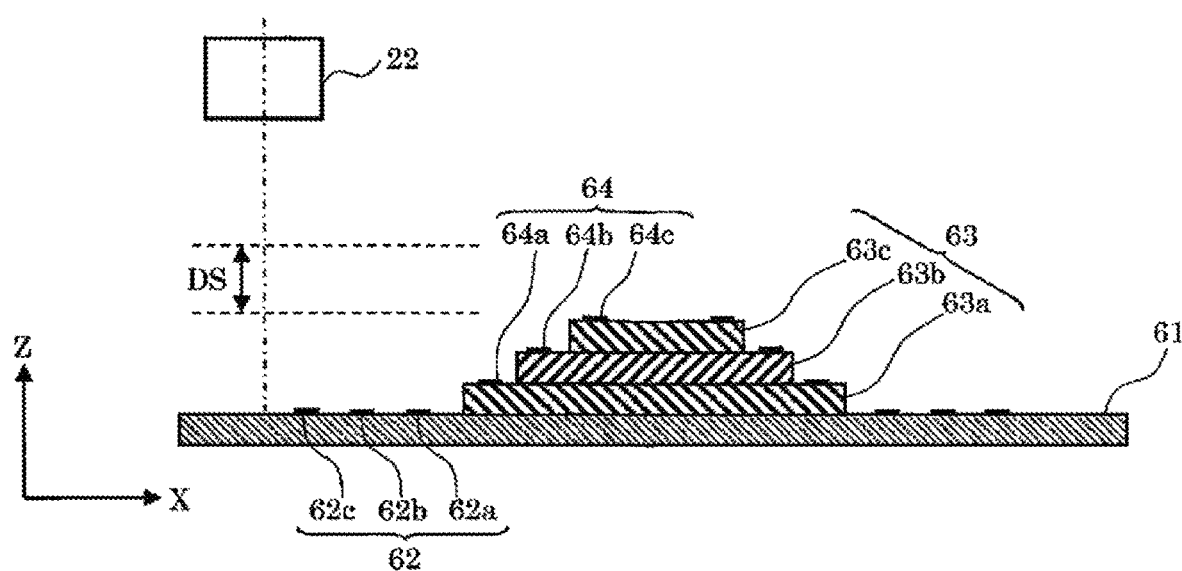
FIG. 9 is a diagram showing a cross section of a laminated device in a state before wire bonding and the depth of field of the imaging apparatus in an adjustment process.
Figure 10:
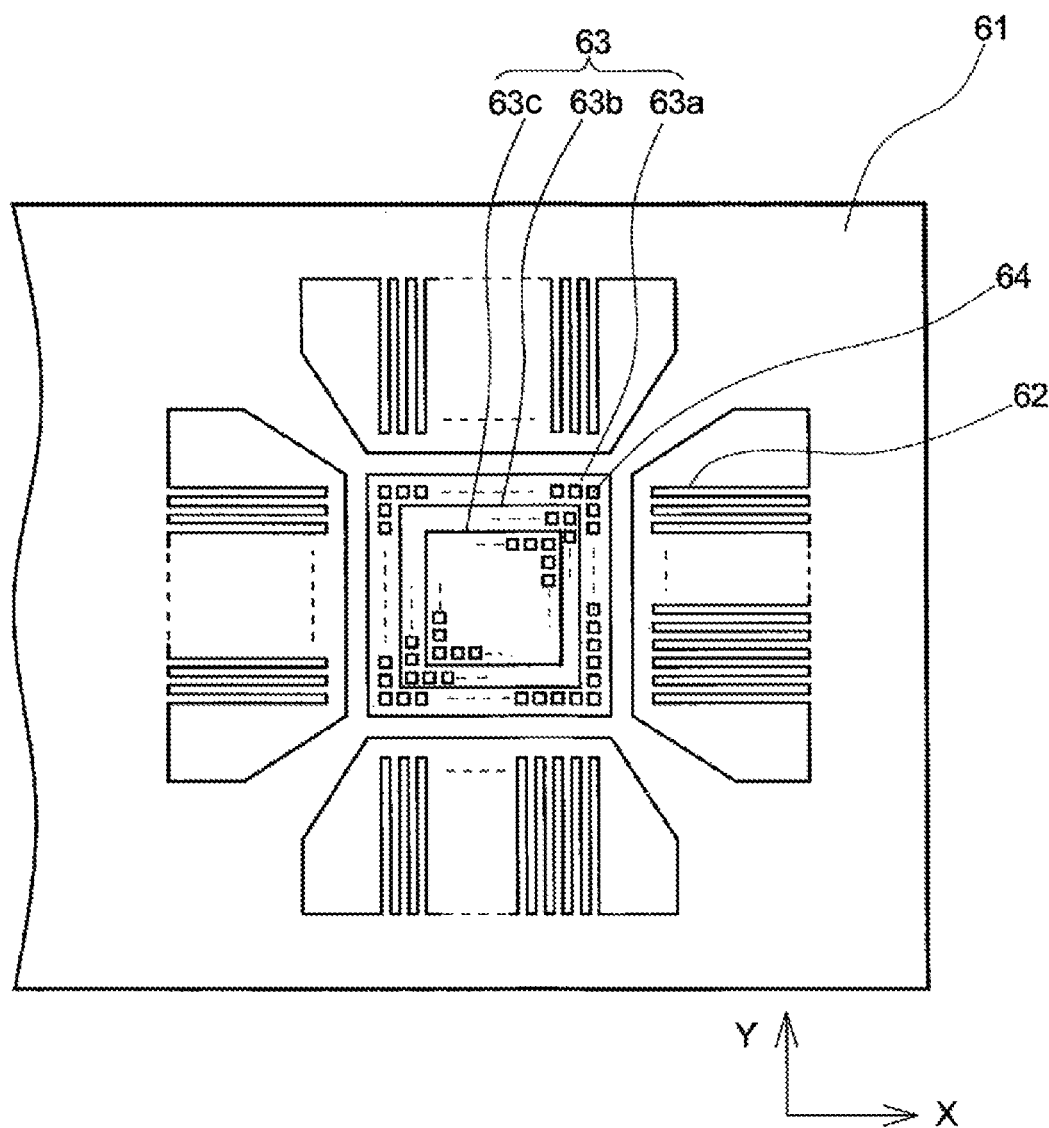
FIG. 10 is a top view of the laminated device in a state before wire bonding.
Figure 11:
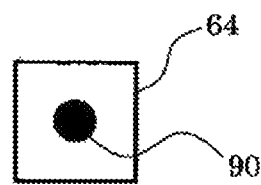
FIG. 11 is a diagram showing an indentation on a pad in offset adjustment.

There are various methods for offset adjustment and one of the methods is described. FIG. 9 is a cross-sectional view of a state before wire bonding of a laminated device in which the semiconductor chips 63 are laminated, and FIG. 10 is a top view of the laminated device. The offset adjustment is performed, for example, using one pad 64 among the plurality of pads 64 of the semiconductor chip 63 shown in FIG. 10. First, as shown in FIG. 11, an indentation 90 is formed on the pad 64 by the capillary 14. Then, the bonding head 11 is moved by the offset amount acquired in advance, so that the optical axis of the imaging apparatus 21 comes onto the pad 64. Then, the indentation 90 on the pad 64 is imaged by the imaging apparatus 21, and the position of the indentation 90 is specified. Thereby, an accurate offset amount is acquired. In this offset adjustment, it is necessary to acquire the position of the indentation 90 or the like with high precision, and imaging with a high optical resolution is required.

Next, the bond coordinate setting is described. Before performing the wire bonding, the bonding position on each of the plurality of pads 64 and the plurality of leads 62 as shown in FIG. 10 are determined in the bond coordinate setting. For example, an image of a mark (not shown) on the surface of the lead frame 61 or an image of a mark (not shown) on the surface of the semiconductor chip 63 is acquired by the imaging apparatus 21, the positions of those marks are specified, and the bonding coordinate setting is performed based on the specified positions. In addition, an image of a predetermined pad 64 or a predetermined lead 62 may be acquired by the imaging apparatus 21, and the position thereof may be specified to set the bonding positions (bond coordinates). In this bond coordinate setting, it is necessary to acquire the positions of the mark, the pad 64, or the lead 62 with high precision, and imaging with a high optical resolution is required.

Returning to FIG. 8, the description of the flow is continued. In S102, when the received process is the adjustment process (S102: Yes), the process proceeds to S104. In S104, the control unit 52 controls the aperture switching mechanism 40 of the imaging apparatus 21 to switch the aperture of the optical system to the high-resolution aperture (the large-diameter aperture). Specifically, the control unit 52 controls the driving motor 42 of the aperture switching mechanism 40 to rotate the cylindrical portion 47 of the aperture switching mechanism 40, so that the large-diameter aperture comes to the optical path. Thereby, an image with a high optical resolution is captured.

Next, in S106, the control unit 52 controls the illumination (the illumination for illuminating the subject) of the imaging apparatus 21 to adjust the brightness. Next, in S108, the control unit 52 performs focus adjustment by moving the camera-side lens 34 (see FIG. 3) of the imaging apparatus 21 forward and backward. That is, the focal length is adjusted. The reason for performing the focus adjustment is that the depth of field is reduced by switching the aperture of the imaging apparatus 21 to the large-diameter aperture, and the subject (the pad of the semiconductor chip or the lead of the lead frame) is very likely to be out of focus. In other words, the focus adjustment is performed to focus on the subject.

Next, in S110, the control unit 52 performs adjustment process such as the offset adjustment or the bond coordinate setting described above. Because an image with a high optical resolution is captured by the imaging apparatus 21, the adjustment process can be performed with high precision. FIG. 9 illustrates the introduction unit 22 of the imaging apparatus 21 and an example of a depth of field DS of the imaging apparatus 21 when the adjustment process is performed. As shown in FIG. 9, the depth of field is reduced by using the large-diameter aperture.

In S102 of FIG. 8, when the received process is not the adjustment process (S102: No), the process proceeds to S112. In S112, when the received process is the packaging process (wire bonding) (S112: Yes), the process proceeds to S114. In S114, the control unit 52 controls the aperture switching mechanism 40 of the imaging apparatus 21 to switch the aperture of the optical system to the normal aperture (the small-diameter aperture). Specifically, the control unit 52 controls the driving motor 42 of the aperture switching mechanism 40 to rotate the cylindrical portion 47 of the aperture switching mechanism 40, so that the small-diameter aperture comes to the optical path. Thereby, an image with a large depth of field is captured.

Figure 12:
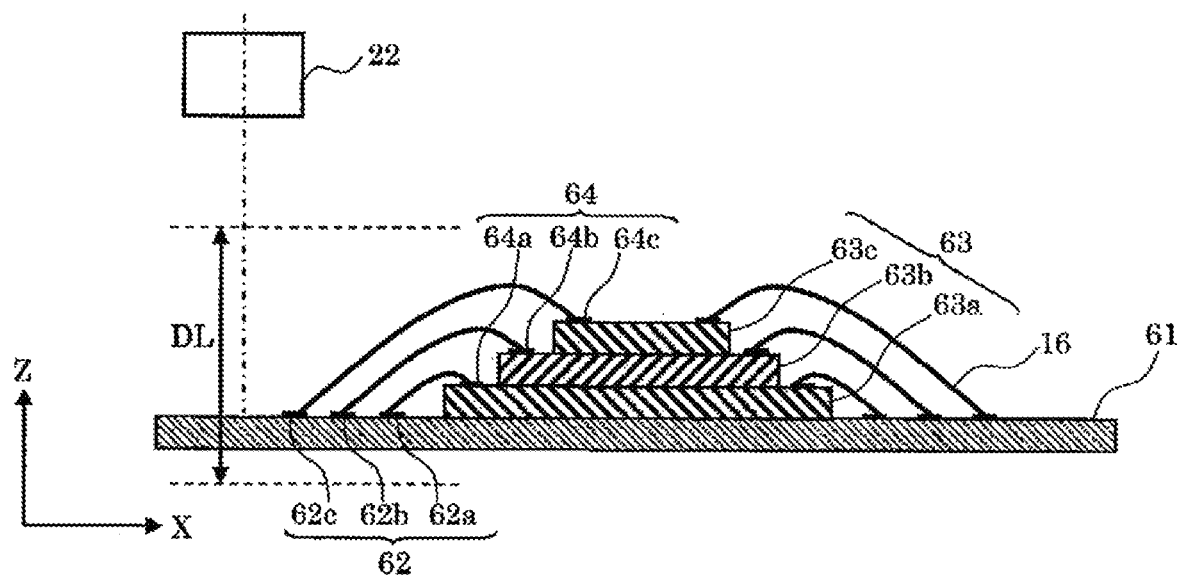
FIG. 12 is a diagram showing a cross section of the laminated device in a state after wire bonding, and the depth of field of the imaging apparatus in wire bonding (packaging process).

Next, in S116, the control unit 52 controls the illumination (the illumination for illuminating the subject) of the imaging apparatus 21 to adjust the brightness. Here, the focus adjustment (the adjustment of the focal length) is not necessarily required. The reason is that the depth of field is increased by switching the aperture of the imaging apparatus 21 to the small-diameter aperture, and the subject (the pad of the semiconductor chip or the lead of the lead frame) is very likely to be focused. Then, in S118, the control unit 52 performs the packaging process (wire bonding). In the embodiment, wire bonding of a laminated device in which semiconductor chips 63*a*, 63*b* and 63*c* are laminated in three layers on the lead frame 61 shown in FIG. 9 is performed. FIG. 12 is a cross-sectional view showing a state after wire bonding has been performed on the laminated device of FIG. 9. As shown in FIG. 12, by the packaging process, each of the pads 64*a*, 64*b*, and 64*c* of the semiconductor chips 63*a*, 63*b*, and 63*c* of each layer and the corresponding leads 62*a*, 62*b*, and 62*c* of the lead frame 61 are connected by the wire 16. Each of the semiconductor chips 63*a*, 63*b* and 63*c* has a thickness, and therefore each of the pads 64*a*, 64*b* and 64*c* has a step with each other in the Z-direction which is the height direction.

FIG. 12 shows the introduction unit 22 of the imaging apparatus 21 and an example of a depth of field DL of the imaging apparatus 21 when the packaging process is performed. As shown in FIG. 12, the step between the pad 64*c* on the uppermost surface of the laminated device and the lead 62c is very large. Therefore, in order to perform wire bonding of this laminated device, it is necessary to widen the visible range in the thickness direction (the Z-direction) by the imaging apparatus 21. In the embodiment, when the packaging process is performed, the small-diameter aperture is used to increase the depth of field, and thus the visible range in the thickness direction is widened as shown in FIG. 12, and the wire bonding can be performed with high precision.

Returning to FIG. 8, the description of the flow is continued. In S112, when the received process is not the packaging process (S112: No), the process proceeds to S120. In this case, in the embodiment, it is assumed that the measurement process after packaging process has been received. Here, the measurement process after packaging process includes, for example, measurement of the clearance amount on the pad, detection of the ball diameter on the pad, and the like. In order to perform these processes with high precision, it is necessary to capture a high-resolution image by the imaging apparatus. Therefore, the high-resolution aperture is used in the measurement process as described later.

Figure 14:
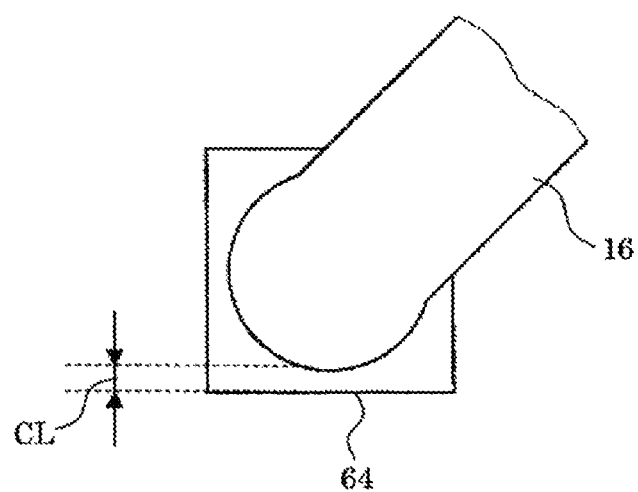
FIG. 14 is an enlarged view of a pad to which a wire is connected.

As shown in FIG. 14, the measurement of the clearance amount on the pad is to measure a clearance amount CL of the pad 64 to which the wire 16 is connected (bonded). In addition, the detection of the ball diameter on the pad is to detect the ball diameter by a method disclosed in, for example, Japanese Patent No. 4264458 or Japanese Patent No. 4247729.

In S120 of FIG. 8, the control unit 52 controls the aperture switching mechanism 40 of the imaging apparatus 21 to switch the aperture of the optical system to the high-resolution aperture (the large-diameter aperture). Thereby, an image with a high optical resolution is captured by the imaging apparatus 21. Next, in S122, the control unit 52 controls the illumination (the illumination for illuminating the subject) of the imaging apparatus 21 to adjust the brightness. Then, in S124, the control unit 52 performs the focus adjustment (the adjustment of the focal length) by moving the camera-side lens 34 of the imaging apparatus 21 forward and backward. The steps of S120-S124 are the same as the steps of S104-S108 in the adjustment process.

Figure 13:
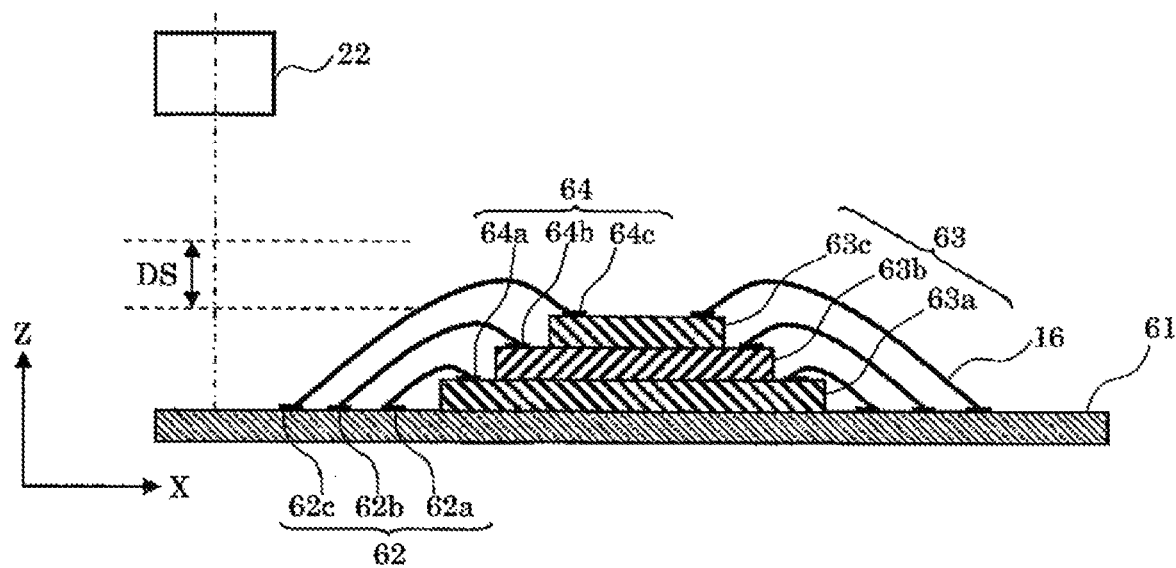
FIG. 13 is a diagram showing the depth of field of the imaging apparatus in a measurement process.

Next, in S126, the control unit 52 performs measurement process such as the measurement of the clearance amount on the pad or the ball diameter detection on the pad described above. Because an image with a high optical resolution is captured by the imaging apparatus 21, the measurement process can be performed with high precision. FIG. 13 shows the introduction unit 22 of the imaging apparatus 21 and an example of the depth of field DS of the imaging apparatus 21 when the measurement process is performed. As shown in FIG. 13, the depth of field is reduced by using the large-diameter aperture.

According to the wire bonder 10 of the embodiment described above, it is possible to increase the depth of field by using the imaging apparatus 21 in the state of the first aperture having a small aperture hole diameter to perform, with high precision, packaging with a thick laminated device or the like, and to increase the optical resolution by using the imaging apparatus 21 in the state of the second aperture with a large aperture hole diameter to perform, with high precision, additional processes (adjustment process, measurement process) before and after the packaging process.

In the embodiment described above, the case in which wire bonding of the laminated device is performed has been described as an example. However, the wire bonding may be performed on one semiconductor chip 63 die-bonded to the lead frame 61 instead of on the laminated device. That is, even when the single-layer semiconductor chip 63 is wire-bonded, it is required to widen the visible range of the imaging apparatus 21 in the thickness direction, and thus the depth of field is increased by using the imaging apparatus 21 in the state of the first aperture having a small aperture hole diameter. Thereby, the wire bonding can be performed with high precision.

In the embodiment described above, the aperture switching mechanism 40 of the imaging apparatus 21 is the aperture switching mechanism shown in FIG. 4. However, the aperture switching mechanism 40 is not limited to the one shown in FIG. 4. For example, the aperture switching mechanism 40 may be capable of switching among three or more types of aperture hole diameters. In addition, the aperture switching mechanism 40 may be capable of continuously changing the aperture hole diameter. In addition, the aperture switching mechanism 40 may be an aperture switching mechanism that allows the operator to manually switch the aperture hole diameter without using the power of the driving motor 42. In addition, the aperture switching mechanism 40 may be configured so that a disc-shaped member in which holes having plural types of aperture hole diameters are formed along the circumferential direction is rotatably connected to the cross section of a cut arranged on the side wall of the lens barrel 23, and a specific aperture hole of the disk-shaped member comes to the optical path by rotating the disk-shaped member. In addition, the aperture switching mechanism 40 may be configured so that a substantially rectangular flexible member in which holes having plural types of aperture hole diameters are formed along the longitudinal direction is disposed inside the lens barrel 23 (disposed along two opposing inner walls so that a part of the flexible member is located in the optical path), and a specific aperture hole of the flexible member comes to the optical path by causing the flexible member to slide in the longitudinal direction.

Figure 15:
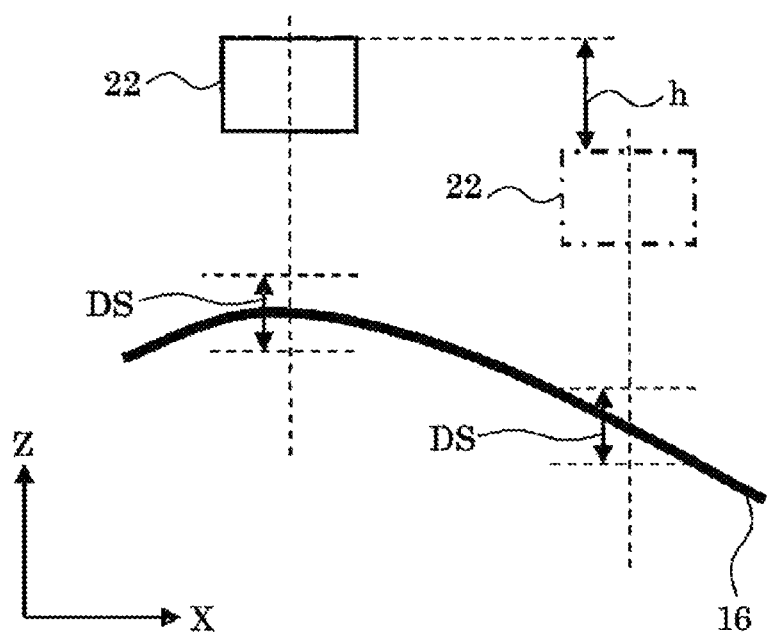
FIG. 15 is a diagram for illustrating a method of measuring the height of a wire.

Next, a process for switching the imaging apparatus 21 to the high-resolution aperture to measure the height of the wire 16 connected to the pad of the semiconductor chip is described. FIG. 15 is a diagram for illustrating a method of measuring the height of the wire 16. FIG. 15 shows the position of the introduction unit 22 of the lens barrel of the imaging apparatus 21 and the depth of field DS. When the imaging apparatus 21 is switched to the high-resolution aperture, the depth of field DS is reduced as shown in FIG. 15. Therefore, even when the position of the introduction unit 22 (the lens barrel) in the Z-direction (up-down direction) is slightly changed, the wire 16 is blurred (out of focus). Thus, the height of the wire 16 is measured using this principle.

First, the introduction unit 22 (the lens barrel) is moved up and down to a position at which the wire 16 is focused, and the position at which the wire 16 is focused is searched for. This is performed with a fixed focal length. Then, the introduction unit 22 is stopped at the focused position, and the control unit 52 acquires the stop position of the introduction unit 22 in the Z-direction. The left side of FIG. 15 illustrates a state in which the introduction unit 22 is stopped at the position where the wire 16 is focused. The height (the position in the Z-direction) of the wire 16 can be obtained from the stop position of the introduction portion 22 in the Z-direction. Here, the introduction unit 22 (the lens barrel) of the imaging apparatus 21 is moved up and down, but the lens in the imaging apparatus 21 may be moved to search for the position at which the wire 16 is focused, and the height of the wire 16 may be obtained from the focused position of the lens. In this manner, the optical position of the imaging apparatus 21 is changed to search for the position at which the wire 16 is focused, and the height of the wire 16 is obtained from the optical position of the imaging apparatus 21 at the focused position.

In addition, the change amount of the height of the wire 16 can be measured as follows. The stop position of the introduction unit 22 in the Z-direction on the left side of FIG. 15 is referred to as a "first stop position". Then, in order to detect the height of the wire 16 at another position, as shown on the right side of FIG. 15, the introduction unit 22 is moved in the X-direction, and the same process as described above is performed. That is, the introduction unit 22 is moved up and down to the position at which the wire 16 is focused, and the introduction unit 22 is stopped at the focused position. Besides, this is performed with a fixed focal length, and with the same focal length as when the first stop position on the left side of FIG. 15 is detected. The control unit 52 acquires a stop position of the introduction unit 22 in the Z-direction (hereinafter, referred to as a "second stop position"). Thereby, a change amount h of the height of the wire 16 can be acquired from the difference between the first stop position and the second stop position.

Besides, if this method is used, it is possible to measure not only the height of the wire 16 but also the height of the semiconductor chip from the lead frame (substrate). That is, the focal length of the imaging apparatus 21 is fixed, the optical position of the imaging apparatus 21 is changed to search for a position at which the upper surface of the semiconductor chip is focused, and the height of the semiconductor chip from the lead frame can be acquired based on the optical position of the imaging apparatus 21 at the focused position. Furthermore, if this method is used, it is also possible to measure the height of the press-bonded ball formed when the wire 16 is press-bonded to the pad (electrode) of the semiconductor chip 63. That is, the focal length of the imaging apparatus 21 is fixed, the optical position of the imaging apparatus 21 is changed to search for a position at which the press-bonded ball is focused, and the height of the press-bonded ball can be acquired based on the optical position of the imaging apparatus 21 at the focused position. It is possible to detect a bonding failure between the wire 16 and the pad (electrode) by measuring the height of the press-bonded ball. When the imaging apparatus 21 is switched to the normal aperture and the depth of field is increased, the focused range is widened, and thus the method described above cannot be performed with high precision. That is, the method described above is a method that can be performed with high precision by switching the imaging apparatus 21 to the high-resolution aperture.

In the embodiment described above, the bonding apparatus is a wire bonder. However, the bonding apparatus may be a die bonder or a flip-chip bonder. That is, the imaging apparatus 21 described above may be arranged on a die bonder or a flip-chip bonder. When the semiconductor chip is die-bonded (packaged) to the lead frame, the imaging apparatus 21 is switched to the normal aperture, and the depth of field is increased. Then, during the measurement process (the inspection process) after the packaging process, the imaging apparatus 21 is switched to the high-resolution aperture, and the measurement process is performed with a high optical resolution. In particular, after the die bonding, it is necessary to inspect whether there are particles or cracks in the semiconductor chip, and inspect the protrusion of paste between the semiconductor chip and the lead frame, and these inspections can be performed with high precision by switching the imaging apparatus 21 to the high-resolution aperture to perform imaging.

What is claimed is:

1. A bonding apparatus comprising an imaging apparatus, the bonding apparatus comprising:
   an aperture switching mechanism arranged in an optical system of the imaging apparatus, wherein the aperture switching mechanism comprises:
   a cylindrical portion having two first holes constituting a first aperture and two second holes constituting a second aperture, wherein the two first holes face each other, and the two second holes face each other, and a diameter of the second holes is greater than a diameter of the first holes, and
   a control unit comprising a processor that controls the cylindrical portion of the aperture switching mechanism to switch to one of a state that the two first holes are located in an optical path of the imaging apparatus to form the first aperture and a state that the two second holes are located in the optical path of the imaging apparatus to form the second aperture;
   wherein the control unit is configured to perform a packaging process by switching to the first aperture, and perform an additional process other than the packaging process by switching to the second aperture.

2. The bonding apparatus according to claim 1, wherein when the aperture switching mechanism is switched to the first aperture to perform the packaging process, the control unit does not adjust a focal length after switching the aperture, and
   when the aperture switching mechanism is switched to the second aperture to perform the additional processes, the control unit adjusts the focal length after switching the aperture.

3. The bonding apparatus according to claim 1, wherein the control unit is configured to perform the additional process, which is an adjustment process before the packaging process, in which a distance between an optical axis of the image apparatus and an capillary of a bonding head of the bonding apparatus is measured and calibrated, or
   a bonding position of the semiconductor chip is set.

4. The bonding apparatus according to claim 1, wherein the control unit is configured to perform the additional process, which is a measurement process after the packaging process for measuring a clearance amount on pads of the semiconductor chip or detecting a ball diameter on the pads of the semiconductor.

5. The bonding apparatus according to claim 1, wherein the control unit is configured to perform the packaging process, in which a wire is boned to the semiconductor chip by a bonding head of the bonding apparatus.

6. The bonding apparatus according to claim 1, wherein the control unit is configured to perform the packaging process in which the semiconductor chip is bonded to a lead frame by a bonding head of the bounding apparatus.

7. The bonding apparatus according to claim 1, wherein the additional process is a measurement process for a height of a wire connected to a pad of the semiconductor chip after the packaging process;
   in the measurement process, the control unit sets a focal length of the imaging apparatus to be fixed, changes an optical position of the imaging apparatus to search for a position at which the wire is focused, and acquires the height of the wire based on the optical position of the imaging apparatus at the focused position.

8. The bonding apparatus according to claim 1,
wherein the additional process is a measurement process for measuring a height of the semiconductor chip from a substrate;
in the measurement process, the control unit sets a focal length of the imaging apparatus to be fixed, changes an optical position of the imaging apparatus to search for a position at which the semiconductor chip is focused, and acquires the height of the semiconductor chip from the substrate based on the optical position of the imaging apparatus at the focused position.

9. The bonding apparatus according to claim 1,
wherein the additional process is a measurement process for measuring a height of a press-bonded ball formed by a wire press-bonded to a pad of the semiconductor chip;
in the measurement process, the control unit sets the focal length of the imaging apparatus to be fixed, changes an optical position of the imaging apparatus to search for a position at which the press-bonded ball is focused, and acquires the height of the press-bonded ball based on the optical position of the imaging apparatus at the focused position.

10. The bonding apparatus according to claim 2,
wherein the control unit is configured to perform the additional process, which is an adjustment process before the packaging process, in which a distance between an optical axis of the image apparatus and an capillary of a bonding head of the bonding apparatus is measured and calibrated, or
a bonding position of the semiconductor chip is set.

11. The bonding apparatus according to claim 2,
wherein the control unit is configured to perform the additional process, which is a measurement process after the packaging process for measuring a clearance amount on pads of the semiconductor chip or detecting a ball diameter on the pads of the semiconductor.

12. The bonding apparatus according to claim 2,
wherein the control unit is configured to perform the packaging process, in which a wire is boned to the semiconductor chip by a bonding head of the bonding apparatus.

13. The bonding apparatus according to 2,
wherein the control unit is configured to perform the packaging process in which the semiconductor chip is bonded to a lead frame by a bonding head of the bounding apparatus.

* * * * *